United States Patent

McDougall et al.

[11] Patent Number: 5,337,001
[45] Date of Patent: Aug. 9, 1994

[54] MAGNETIC FIELD GENERATING ASSEMBLY

[75] Inventors: Ian L. McDougall; Alan G. M. Armstrong, both of Oxon; Robert C. Hawkes, Cambridgeshire, all of England

[73] Assignees: Oxford Medical Limited, Witney, England; E. I. Du Pont de Nemours & Company, Wilmington, Del.

[21] Appl. No.: 941,430
[22] PCT Filed: Apr. 26, 1991
[86] PCT No.: PCT/GB91/00663
 § 371 Date: Dec. 7, 1992
 § 102(e) Date: Dec. 7, 1992
[87] PCT Pub. No.: WO91/17454
 PCT Pub. Date: Nov. 14, 1991

[30] Foreign Application Priority Data

Apr. 27, 1990 [GB] United Kingdom ............. 9009577.9

[51] Int. Cl.[5] .......................................... G01R 33/20
[52] U.S. Cl. .................................................. 324/318
[58] Field of Search .............. 324/300, 307, 309, 310, 324/311, 312, 313, 314, 318, 322

[56] References Cited

U.S. PATENT DOCUMENTS 4,689,591 8/1987 McDougall ..................... 324/318
4,920,316 4/1990 Egloff ............................. 324/318
5,146,924 9/1992 Sepponen ........................ 324/309

FOREIGN PATENT DOCUMENTS 0217520 4/1987 European Pat. Off. .
0307981 3/1989 European Pat. Off. .
0314262 5/1989 European Pat. Off. .
0362931 4/1990 European Pat. Off. .
8809927 12/1988 World Int. Prop. O. .

OTHER PUBLICATIONS

PCT Search Report dated Aug. 7, 1991.

Primary Examiner—Michael J. Tokar

[57] ABSTRACT

A magnetic field generating assembly used in NMR apparatus includes a primary magnetic field generator for generating a primary magnetic field which is substantially homogeneous in the working region. The primary magnetic field generator is constructed such that an object to be examined can be introduced from outside the assembly into the working region in a direction transverse to the direction of magnetic flux through the working region. Gradient magnetic field coils are provided for imposing one or more magnetic field gradients through the working region. The gradient magnetic field coils are movable relative to the primary magnetic field generator for positioning locally to the position of an object to be examined in the working region.

10 Claims, 5 Drawing Sheets

VARIATION OF $B_z$ WITH x DIRECTION SUPERPOSED ON MAGNET $B_z$ $dB_z/dx$

MAGNETIC FIELD GENERATING ASSEMBLY

BACKGROUND OF THE INVENTION

The invention relates to a magnetic field generating assembly for use in nuclear magnetic resonance (NMR) apparatus.

Conventional NMR apparatus has a large solenoidal magnet which generates a high strength magnetic field within its bore with, at the centre of the bore, a working region in which the magnetic field strength is substantially uniform. To achieve the high strengths required for NMR imaging experiments, superconducting solenoids must be used with the superconducting material housed in large cryostats. Additionally, in order to perform an experiment a gradient coil system is provided, usually formed by resistive conductors, to superimpose magnetic gradients on the field within the working region. In operation, a sample to be examined is inserted into the bore of the magnet so that the region of the sample to be examined is located within the uniform working region and the experiment then performed. In order to allow maximum space for the sample, the gradient field system is positioned close to the inner surface of the main coils and this leads to a number of disadvantages. In particular, there is significant coupling between the gradient coils and the surrounding magnetic structure. For example, whenever the current in a gradient coil is changed, the flux threading conductive parts of the magnet structure changes so inducing an emf and an opposing eddy current. This reduces the speed at which each gradient change can be achieved and thus the speed of the overall experiment. Furthermore, large currents need to be supplied to the gradient coils in order to achieve useful magnetic field gradients and changes in these currents also lead to large eddy currents.

SUMMARY OF THE INVENTION

In accordance with the present invention, a magnetic field generating assembly for use in NMR apparatus comprises primary magnetic field generating means for generating a primary magnetic field which is substantially homogeneous in a working region, the primary magnetic field generating means being constructed such that an object to be examined can be introduced from outside the assembly into the working region in a direction transverse to the direction of magnetic flux through the working region; and gradient magnetic field generating means for imposing one or more magnetic field gradients through the working region, the gradient magnetic field generating means being movable relative to the primary magnetic field generating means for positioning locally to the position of an object to be examined in the working region.

A completely new form of magnetic field generating assembly has been devised which represents a new approach to the construction and use of NMR apparatus. The gradient magnetic field generating means (typically in the form of suitably designed coils) can be placed adjacent or within the working region itself and even in contact with the object being examined and so remote from the primary magnetic field generating means. This has a number of significant advantages:

1. The signal to noise ratio is improved by decreasing the separation between the gradient magnetic field generating means and the object;

2. The small volume defined by the gradient magnet field generating means and the open access of the primary magnetic field generating means removes most of the eddy current between the two;

3. The use of this open access type of magnetic field generating assembly in the case of human body NMR imaging allows a patient to be positioned with the main field transverse to his body allowing the use of solenoidal RF coils for providing the RF pulses necessary in an imaging experiment;

4. Sample specific RF coils can be designed to have a high Q factor for greater efficiency;

5. Strong gradient magnetic field generating means close to the object improves resolution;

6. Rapid gradient ramp rates are possible;

7. High patient comfort and low acoustic emissions are achieved which are particularly beneficial in the case of human body imaging;

8. Low cost components can be used for traditionally expensive elements.

9. Higher efficiency is achieved since less current is needed for a given gradient compared with conventional NMR apparatus.

As well as providing local gradient magnetic field generating means, the invention also enables local RF coils to be utilised and in one particularly advantageous arrangement, the gradient magnetic field generating means and RF coils can be mounted on the same former whether flat or in the form of a small cylindrical tube leading to a particularly efficient mechanical unit.

The primary magnetic field generating means can take various forms as for example described in EP-A-0187691 (U.S. Pat. No. 4,689,591) or EP-A-0186998. A further possibility is a C-shaped magnet.

Typically, the primary magnetic field generating means will be formed by a superconducting arrangement such as one or more superconducting coils although an arrangement using high temperature ceramic superconductors or permanent magnets may also be possible.

As has been mentioned above, one of the main advantages of the invention is the locally positioned gradient magnetic field generating means. In one embodiment, what is envisaged is a gradient coil structure (as well as an RF probe) closely coupled to the imaged object such that for any scan the field of view matches the approximately linear region of gradient field. The objective is to provide intense gradient pulses to dephase spins but use weaker gradients for echo collection to avoid excessive imaging bandwidth. Very significant S/N enhancement is available by earlier echo detection (because of the exponentional decay of signal) and further enchancement through successive echo addition when the echo time is short compared to T2. Typically, earlier echo measurement by a factor of 2 corresponds to approximately a factor of 1.6 increase in field, in this case a field of 0.24T. Further, there is approximately a factor of 1.5 increase in S/N when 6 successive echoes are added for a 0.2 echo time to T2 ratio, which in theory means that we can now emulate a field of 0.36T. To make use of these aspects a target of less than 10 ms echo time can be set. Note that a typical echo time of 20 ms is achieved on "conventional" systems and tissue T2's are of the order of 50 ms or more. Whole body systems provide about 0.1 gauss/cm. to at most 1.0 gauss/cm, and we propose to achieve at least 10 gauss/cm. Further it must be recognised that echo addition is not usually possible unless RF pulses are used to refocus static inhomogeneity.

A very important aspect to rapid gradient switching is the corresponding generation of eddy currents. The permanent C section magnet should inherently have a lower and less persistent (shorter duration) eddy current signature due to the nature of the materials of construction. A number of benefits are obtained in image quality by operating in the absence of eddy currents. The fields generated by eddy currents produce time dependent distortions of the field which distort the image and lower resolution. This can have serious consequences if imaging is undertaken with the aim of deriving diagnostic information based on any volumetric analysis of image features. The absence of time dependent field errors allows much longer echo trains to be acquired to enhance S/N. By moving the gradient coil structures away from conducting surfaces eddy currents are reduced because increased flux return path is available, and a larger map between primary gradient coil and conducting surfaces provides increased space to deploy an efficient gradient shield array.

Solenoidal RF coils can be used to surround the sample when the orientation of the Bo field of the magnet is at right angles to the major dimension of the sample. Less efficient saddle shaped coils need to be used with conventional solenoidal magnets. The solenoidal RF coil may surround the sample to give a high filling factor, and maintain a high coil Q factor. This can lead to a gain of up to 3 in S/N over saddle coils.

Single turn "surface coils" could be used completely encompassing the sample to produce further S/N gains as only the region being imaged would contribute to noise. An extension to multislice imaging could be to use a series of coils which are actively switched during the complete acquisition sequence.

A reduced field of view and the collective S/N benefits of sample specific gradient and RF coils means that useful 3D data sets are possible.

Estimates of imaging time can be made for a given RF coil volume and corresponding voxel to receiver coil volume ratio when sampling protons in liquid like samples. For samples which require approximately a 3 cm cubic imaging volume and with sub 10 ms echo times a multislice sequence would provide 1 by 1 by 4 mm resolution in about half a minute. As another example, samples with dimensions 10 by 10 by 5 cm volume could be imaged in 10, half cm thick slices, with 2 mm resolution in 3 minutes, again with 10 ms echo time, using a solenoid coil. For samples in the form of sheets a surface coil above the sample could be used to select a region with cubic geometry in which case a 10 by 10 by 5 cm volume would be imaged in 5, one cm thick slices with 2 mm resolution in 6 minutes.

For true 3D imaging, driven equilibrium sequences are well suited to the "fog dispersal" approach because a complete set of phase encode steps can be applied rapidly (of the order of 20 ms per step) giving a first 2D image in a few seconds and 3D volume in a minute or so. The estimates above are based on "successful" imaging time at 0.5T.

The invention can be applied in a wide variety of fields including not only whole body, body parts, and animal nuclear magnetic resonance imaging but also other industrial and commercial applications involving the identification, characterization, measurement, quality assurance and control of materials, components, and assemblies. While not intended to be exhaustive, some specific examples of these applications could be identification of drugs or explosives, characterization of green body ceramics, measurement of oil saturation and permeability in drilled cores, quality assurance in polymer and ceramic processing, and quality control in foodstuffs or laminate or fiber reinforced composites.

Embodiments of magnetic field generating assemblies according to the invention will now be described with reference to the accompanying drawings, in which.

Figure 6:
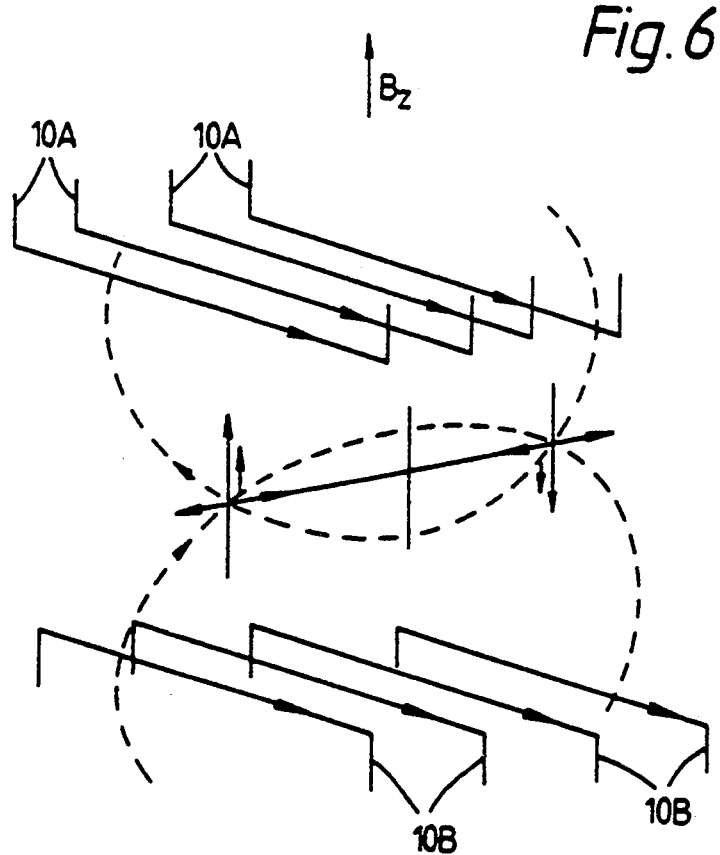
FIG. 6 illustrates the active tracks of the X gradient coil and the schematic flux path from each gradient half that interact through symmetry to provide the necessary gradient of $B_z$ with direction X.
Figure 7:
Figure 8:
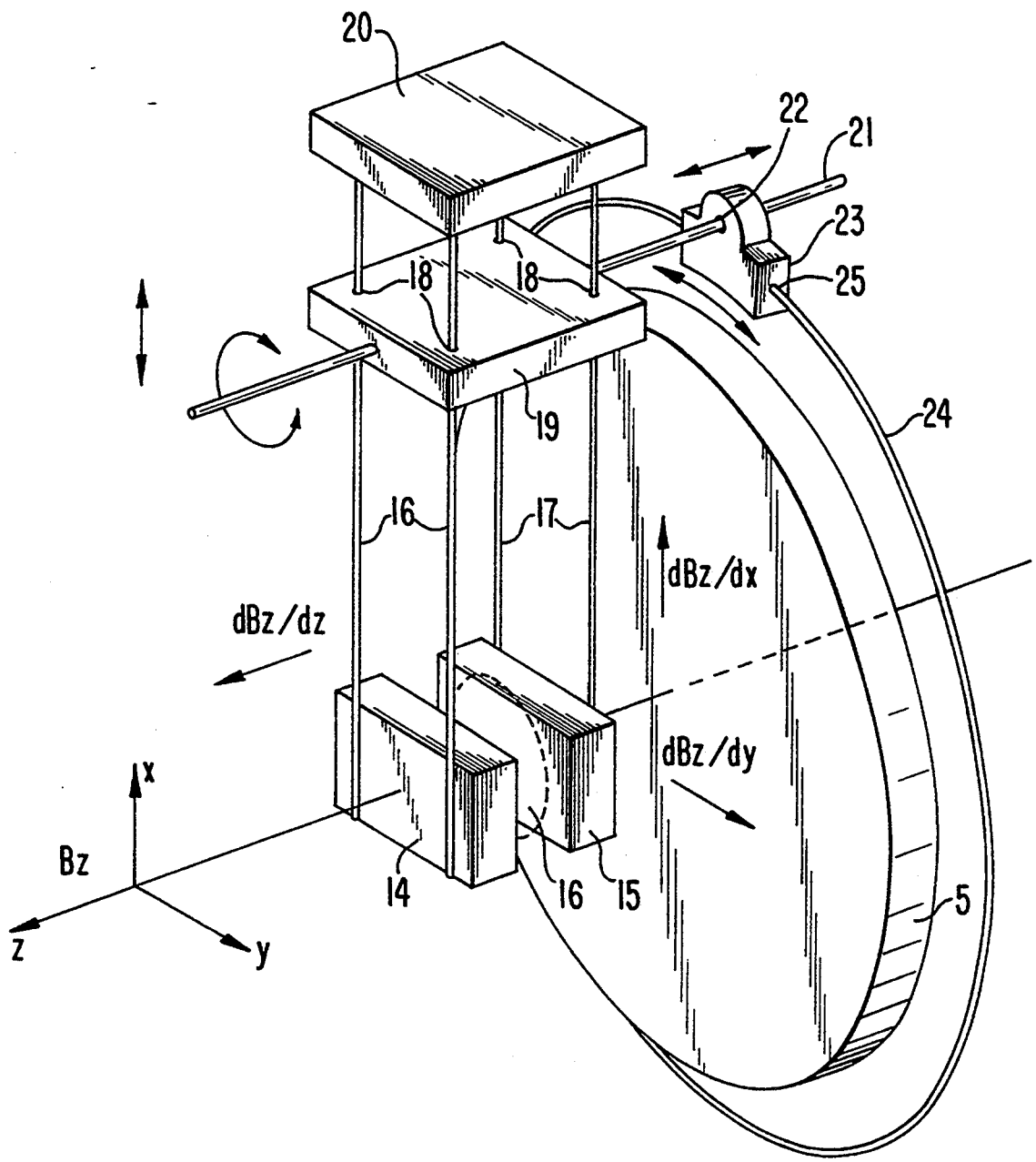

FIG. 7 indicates how $B_z$ varies in intensity with x;and,

FIG. 8 illustrates an example of a gradient system based on the FIG. 6 example.

DESCRIPTION OF THE PREFERRED EMBODIMENTS

Figure 1:
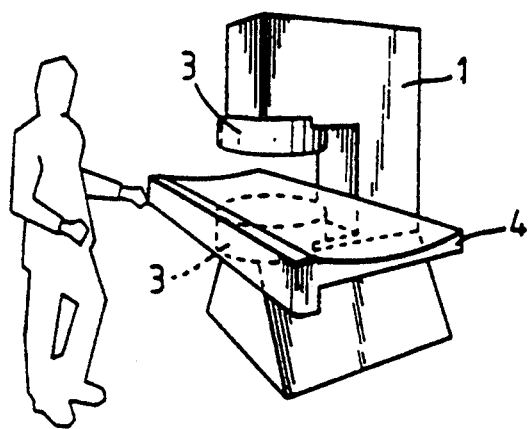
FIG. 1 is a schematic, perspective view of a first embodiment according to the invention.
Figure 2:
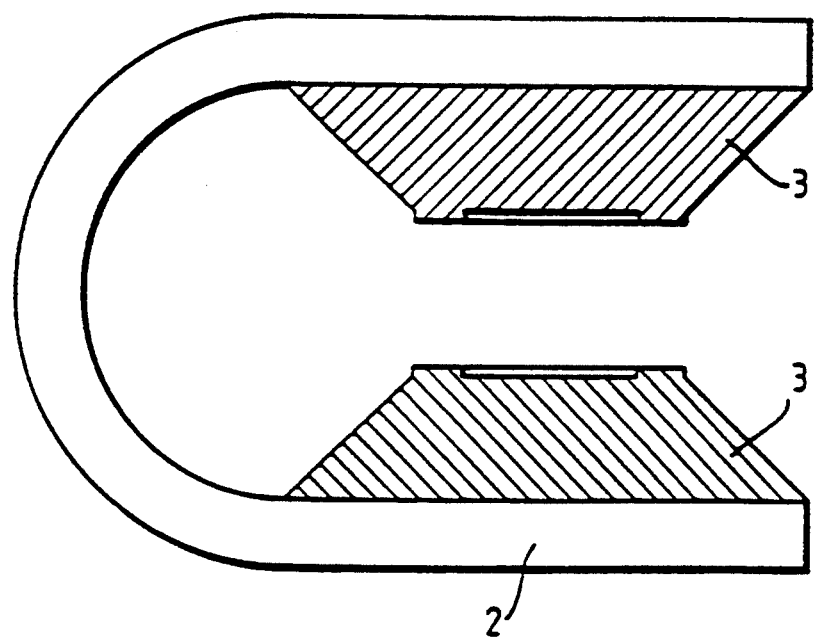
FIG. 2 illustrates the C-magnet in FIG. 1 in more detail.

The FIG. 1 example is based on the use of a C-shaped magnet 1 which comprises a U-shaped iron body 2 (FIG. 2) and a pair of ferrite pole pieces 3. A non-magnetic table 4 is positioned between the pole pieces 3 on which a sample to be inspected lies in use. It will be seen from FIG. 1 that a sample can be positioned in the region between the pole pieces 3 very easily with most of the sample not being surrounded by the magnet structure.

Figure 3:
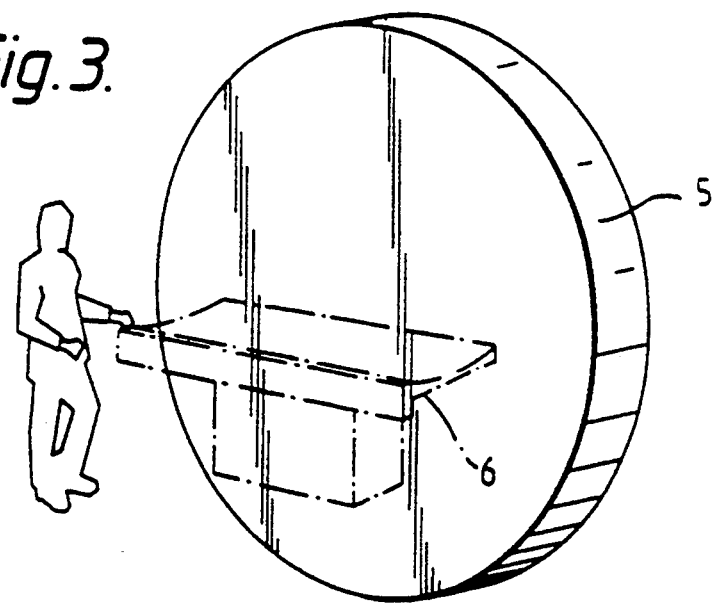
FIG. 3 is a schematic, perspective view of a second embodiment according to the invention.

A second embodiment is shown in FIG. 3 in which a solenoid magnet 5 is positioned to one side of a table 6 and generates a projected uniform region through which the table 6 passes. The construction of the solenoid 6 can be seen in more detail in FIG. 4 and is similar to the solenoid described in U.S. Pat. No. 4,689,591 which is incorporated herein by reference. The magnet 5 has a set of coaxial, superconducting coils 5A positioned within a cryostat 5B.

Figure 5:
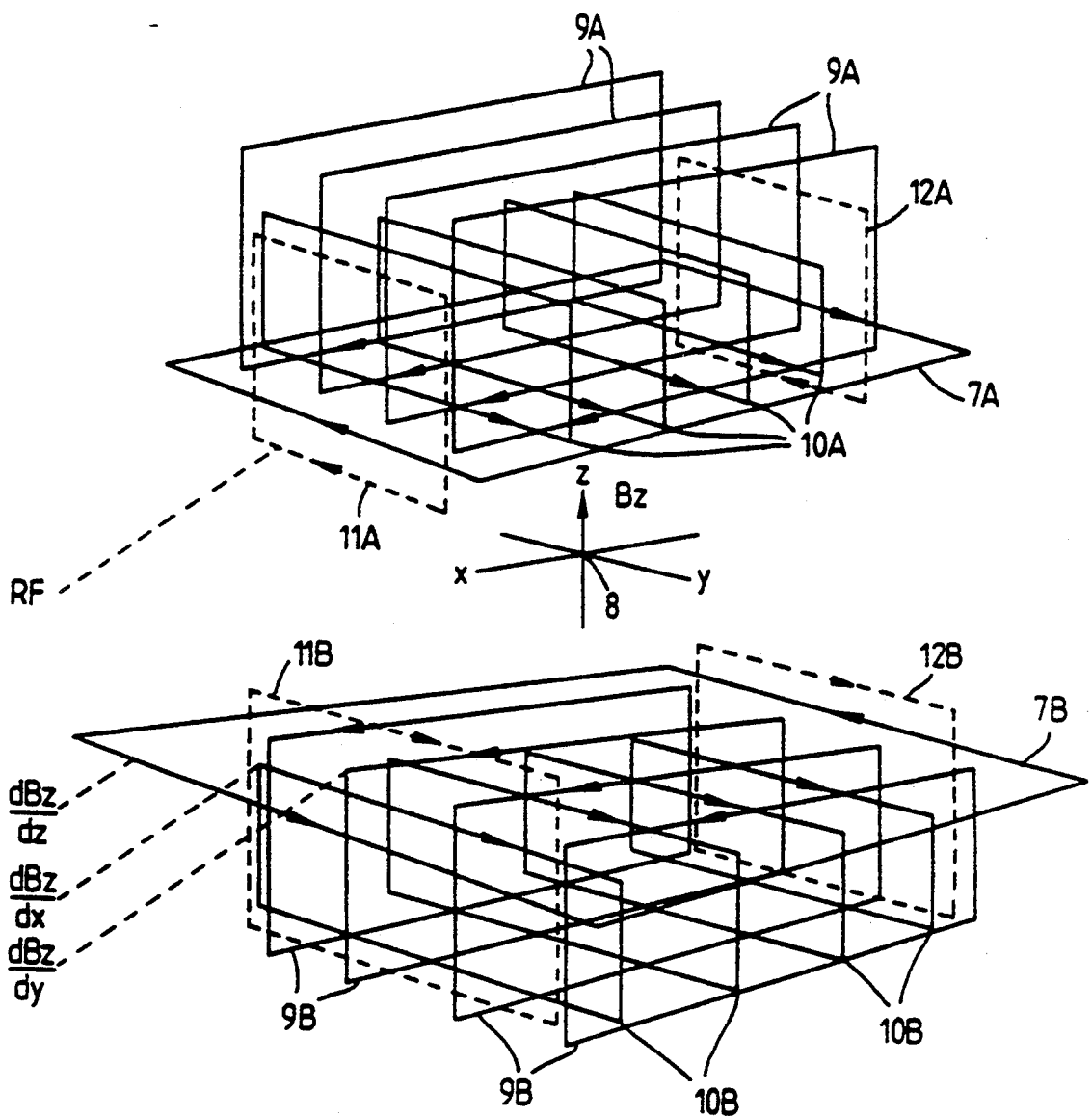
FIG. 5 illustrates a combined rf and gradient coil set.

FIG. 5 illustrates an example of a combined rf and gradient coil set for use with either of the systems shown in FIGS. 1 and 3. The gradient coils comprise a pair of Z gradient coils 7A, 7B provided symmetrically about an origin 8 of the gradient coil set for generating a magnetic gradient in the Z direction. Four pairs of Y gradient coils 9A, 9B are positioned symmetrically about the origin 8 for generating a magnetic field gradient in the Y direction. Four pairs of X gradient coils 10A, 10B are positioned symmetrically about the origin 8 to generate a gradient magnetic field in the X direction.

In practice, different numbers of X, Y, and Z gradient coils can be used. In one practical example, the conductors defining the X gradient coils are 42 in number, 21 in the plane Z=−23 cm and 21 in the plane Z=+23 cm relative to the origin 8. The conductors extend from Y=−40 cm to Y=+40 cm and are located (centre line) at ±X =4, 8, 12, 16, 20, 24, 28, 32, 36, 40 cm and X=0.

In addition to the gradient coils, two pairs of RF coils 11A, 11B, and 12A, 12B are provided symmetrically about the origin 8.

All the gradient and rf coils are mounted on a former (not shown) so that they can be moved relative to the main magnet and positioned locally to the sample to be inspected.

FIG. 6 illustrates the X gradient coils 10A, 10B and in dashed lines the manner in which the component of the magnetic field in the Z direction ($B_z$) varies in intensity with X.

This variation is indicated also in FIG. 7.

Figure 4:
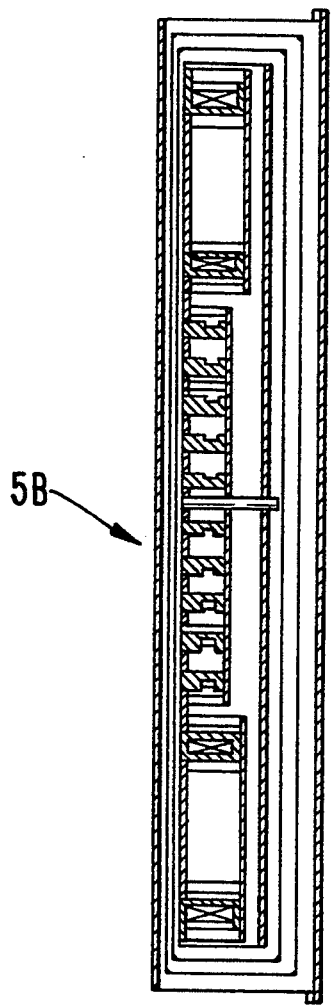
FIG. 4 is a cross-section through the primary magnet shown in FIG. 3 in more detail.

FIG. 8 illustrates schematically an example of a gradient coil system for use with a "flat" magnet of the type shown in FIGS. 3 and 4. The system comprises two sets of gradient coils 14, 15 which include coil sets of the type shown in FIG. 5. A working region 16 is defined between the coil sets 14, 15. The coil sets are suspended from respective pairs of supports 16, 17 in the form of elongate rods, the rods extending through apertures 18 in a plate 19 and depending from a support plate 20. The apertures 18 include fixtures (not shown) which enable the rods 16, 17 to be fixed at any position while permitting the rods to be slid under pressure in the X direction. The lateral position of the plate 19 and hence the coil sets 14, 15 along the Z axis is controlled by supporting the plate on a rod 21 slidably mounted in an aperture 22 of a support 23. The support 23 is slidably mounted on a circular guide 24 which extends through a bore 25 in the support 23 enabling the support 23 to be slid along the guide and thus move the gradient coil sets 14, 15 in the Y direction.

To appreciate the advantages of locally positioned gradient coils, some simple calculations have been carried out based on the use of solenoidal gradient coils. From these calculations, if one decreases an arc radius, then the Bo field increases as $1/r$ and the first order gradient as $1/r^2$. This means that decreasing a cylindrical former from say 750 mm diameter, to say 150 mm, gives an increase in gradient strength nominally of 25 times. Adjustment to hold linearity may reduce this gain and flat sets may not be possible with the same strength per amp as cylindrical sets. However, it appears feasible to increase the strength of gradient coils in the sample specific form by an order of magnitude.

Implications of this gradient coil strength increase on the power dissipation and drive requirements are substantial in terms of cost. Smaller currents produce traditional gradient strengths and coil inductances are reduced, so permitting the same drive voltages to switch gradient field faster. In the Table below this point illustrated for a gradient set to fit a disc magnet of 1.2 m in length. It is believed feasible to drive flat sample specific gradient coils faster than cylindrical sets close fitting the bore of solenoidal magnets—may be 2 to 3 times, while still using low cost linear power amplifiers rated at around 150 Amps at 150 volts. Gradients stronger than available from whole body NMR sets would be available, probably up to 20 mT/m with fast switching, to deal with large samples such as aerofoils. Linearity has not been investigated but using techniques developed for whole body coils employing stream functions it seems that the recruited linearity can be produced for acceptable coil efficiencies.

TABLE

The following parameters are based on magnet length of 1.2 m. A peak current of 140A has been assumed. Given an eddy current over-shoot of 1.9-2.0 and 10% duty cycle, one has a DC operating current of 70A (approximate). The conductors are assumed to have a cross section of 3.2 mm$^2$ (copper) in order to provide sufficient resistance for a "crown" type amplifier to operate efficiently. All coil sets were designed to produce ±20% linearity over 50 cm d.s.v.

| Gradient Strength mT/m − 1 | Peak PSU V for 1ms rise Volts | Approx Power dissipation kW/axis |
|---|---|---|
| 650 mm Diameter Coil | | |
| 10.0 | 178 | 2.5 |
| 12.5 | 262 | 3.7 |
| 15.0 | 401 | 5.6 |
| 750 mm Diameter Coil | | |
| 10.0 | 287 | 4.0 |
| 12.5 | 423 | 5.9 |
| 15.0 | 667 | 8.5 |
| 850 mm Diameter Coil | | |
| 10.0 | 465 | 6.5 |
| 12.5 | 667 | 9.3 |
| 15.0 | 860 | 12.0 |

What is claimed is:

1. A magnetic field generating assembly for use in NMR apparatus, the assembly comprising:
   a primary magnetic field generating means for generating magnetic flux in a direction defined by a primary magnetic field which is substantially homogeneous in a working region, the primary magnetic field generating means being constructed such that an object to be examined is introduced from outside the assembly into the working region in a direction transverse to the direction of magnetic flux through the working region; and
   a gradient magnetic field generating means for imposing one or more magnetic field gradients through the working region, the gradient magnetic field generating means being movable relative to the primary magnetic field generating means for positioning locally to the position of an object to be examined in the working region; and
   wherein the gradient magnetic field generating means is mounted to a support structure which is fixed relative to said primary magnetic field generating means and which enables the gradient magnetic field generating means to be moved in any one or more of three orthogonal directions relative to the working region.

2. An assembly according to claim 1, further comprising an RF coil mounted for movement with the magnetic gradient field generating means.

3. An assembly according to claim 1, wherein the working region is projected beyond the volume defined by the primary magnetic field generating means.

4. An assembly according to claim 1, wherein the primary magnetic field generating means comprises a C-magnet.

5. An assembly according to claim 1, wherein the primary magnetic field generating means comprises a superconducting magnet.

6. An assembly according to claim 2, wherein the working region is projected beyond the volume defined by the primary magnetic field generating means.

7. An assembly according to claim 2, wherein the primary magnetic field generating means comprises a C-magnet.

8. An assembly according to claim 2, wherein the primary magnetic field generating means comprises a superconducting magnet.

9. An assembly according to claim 3, wherein the primary magnetic field generating means comprises a superconducting magnet.

10. An assembly according to claim 4, wherein the primary magnetic field generating means comprises a superconducting magnet.

* * * * *